United States Patent [19]

Benvenuto et al.

[11] Patent Number: 4,677,423

[45] Date of Patent: Jun. 30, 1987

[54] ADPCM CODER-DECODER INCLUDING PARTIAL BAND ENERGY TRANSITION DETECTION

[75] Inventors: Nevio Benvenuto, Venezia, Italy; Guido Bertocci, Neptune, N.J.

[73] Assignee: American Telephone & Telegraph, AT&T Bell Laboratories, Murray Hill, N.J.

[21] Appl. No.: 816,578

[22] Filed: Jan. 6, 1986

[51] Int. Cl.[4] ............................................. H03M 7/00
[52] U.S. Cl. ............................................. 340/347 DD
[58] Field of Search ................... 375/27; 340/347 DD

[56] References Cited

U.S. PATENT DOCUMENTS

| | | | |
|---|---|---|---|
| 4,375,013 | 2/1983 | Cointot | 340/347 DD |
| 4,437,087 | 3/1984 | Petr | 340/347 |
| 4,592,070 | 5/1986 | Chow | 375/27 |

OTHER PUBLICATIONS

*CCITT Recommendation,* Fascicle III.3–Rec. G.721,-7.2 Coding of Analogue Signals by Methods Other Than PCM—"32 kbit/s Adaptive Differential Pulse Code Modulation (ADPCM)–(Malaga–Torremolinos 1984), pp. 125 through 159.

*Primary Examiner*—Charles D. Miller
*Attorney, Agent, or Firm*—Thomas Stafford

[57] ABSTRACT

In an ADPCM coder and decoder including a so-called locking-unlocking adaptation speed control, the adaptation speed is locked to a very slow, almost constant, speed of adaptation for voiceband data and partial band energy signals, i.e., tones and tone like signals, and is unlocked to achieve a fast speed of adaptation for speech. When a so-called partial band energy signal is being inputted, the adaptation speed is biased toward the unlocked state and when a transition occurs from a partial band energy signal to another such signal, the adaptation speed is set to the totally unlocked state and coefficients of an adaptive predictor are set to prescribed values. This is done in both the coder and decoder to minimize generation of impulse noise in the decoder output.

28 Claims, 8 Drawing Figures

FIG. 5   ADAPTIVE ZERO PREDICTOR B(z)

FIG. 6   ADAPTATION SPEED CONTROL 106

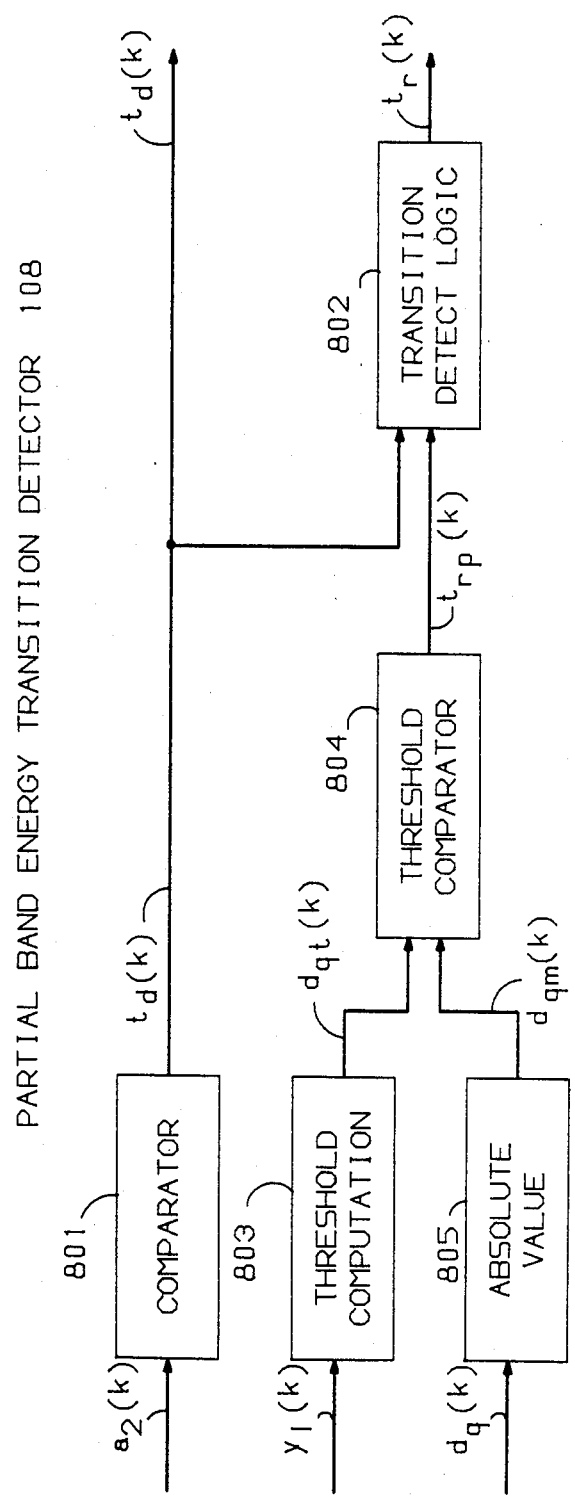

ADPCM CODER-DECODER INCLUDING PARTIAL BAND ENERGY TRANSITION DETECTION

TECHNICAL FIELD

This invention relates to adaptive quantization and prediction in differential PCM coding of speech and voiceband data.

BACKGROUND OF THE INVENTION

Over the past several years there has been, and continues to be, a tremendous amount of activity in the area of efficient encoding of speech. For an evolving digital telephone network, a most important application is the possible replacement of the 64,000 bit-per-second (b/s) PCM signal (8 bits per time slot, repeated at an 8 kHz rate) with other coding algorithms for telephony—both in the public switched and private line networks. The reason, of course, is to achieve bandwidth compression.

For a realistic mix of input speech and voiceband data, adaptive differential PCM appears to be a most promising approach. One form of adaptive differential PCM coding is disclosed, for example, in U.S. Pat. No. 4,437,087 issued to D. W. Petr on Mar. 13, 1984 and can be considered a benchmark since a single encoding with this ADPCM coder at 32 kb/s is near to being subjectively equivalent to 64 kb/s $\mu$255 PCM. Also see COM XVIII-R31, "Recommendation G.721—32 kbits/s Adaptive Differential Pulse Code Modulation (ADPCM)", VII$^{th}$ CCITT Plenary Assembly, Maloga-Torremolinos, Spain, Vol. III, pp. 125-159, October 1984, for details of one such prior ADPCM coder and decoder arrangement. This prior ADPCM coder and decoder arrangement employs a so-called locking quantizer (inverse quantizer) adaptation speed control unit which locks the quantizer scale factor for voiceband data and tone like signals, i.e., partial band energy signals.

The prior coder and decoder arrangement although operating satisfactorily in most applications does not operate completely satisfactorily in applications including transitions from a so-called partial band energy signal to another such signal. Partial band energy signals include single tones, multifrequency tones, touch-tones and the like. A specific problem is experienced using frequency shift keyed (FSK) modems. In such modems, a logical 1 is represented by a first single tone signal, e.g., 1200 Hz, and a logical 0 is represented by a second single tone signal, e.g., 2200 Hz. In the continuous carrier mode of operation of a FSK modem, e.g., a 202 type modem, the modem transmits a single frequency tone representing "space", i.e., all logical 1's, between actual characters. A typical signal generated from typing at a keyboard consists of a long interval of the single frequency tone followed by a few bits of data, i.e., characters in ASCII format, then the single frequency tone again and so on.

We have determined that under such signal conditions the prior ADPCM coder and decoder arrangement disclosed in the D. W. Petr patent and the CCITT Recommendation G.721, both cited above, has problems in tracking the transitions from one tone to another, which results in the generation of large amounts of impulse noise at the output of the decoder. The impulse noise causes character errors between transmitting and receiving modems.

Specifically, the impulse noise is caused by the adaptive predictor and adaptive quantizer in the coder and by the adaptive predictor and adaptive inverse quantizer in the decoder adapting almost perfectly to the single frequency tone, e.g., 1200 Hz. That is to say, the adaptive predictor is generating a signal estimate which is substantially identical to the single frequency tone and the adaptive quantizer (inverse quantizer) is locking and scaling down to the very small difference signal resulting from the algebraic subtraction of the signal estimate from the single frequency tone. Upon a transition to another single frequency tone, e.g., 2200 Hz, the difference signal can become extremely large; sometimes more than twice the magnitude of the single frequency tone input signal. Consequently, the decoder output does not reflect the coder input signal for many samples until the predictor and quantizer (inverse quantizer) have adapted to the new single frequency tone input signal.

SUMMARY OF THE INVENTION

The generation of impulse noise in differential PCM transmission is minimized, in accordance with an aspect of the invention, by detecting transitions from one partial band energy signal to another partial band energy signal and by controllably setting the adaptive predictor coefficients to prescribed values. This is done in both the coder and decoder.

In a specific embodiment, the adaptive quantizer (inverse quantizer) adaptation speed control is biased toward a so-called unlocked state when the presence of a partial band energy input signal is detected and set to a totally unlocked state when a transition occurs from the partial band energy signal to another such signal.

BRIEF DESCRIPTION OF THE DRAWING

The invention will be more fully appreciated friom the following detailed description when considered in conjunction with the accompanying figures, in which:

FIG. 8 depicts in simplified block diagram form details of the partial band energy transition detector employed in the coder of FIG. 1 and decoder of FIG. 2.

DETAILED DESCRIPTION

Figure 1:
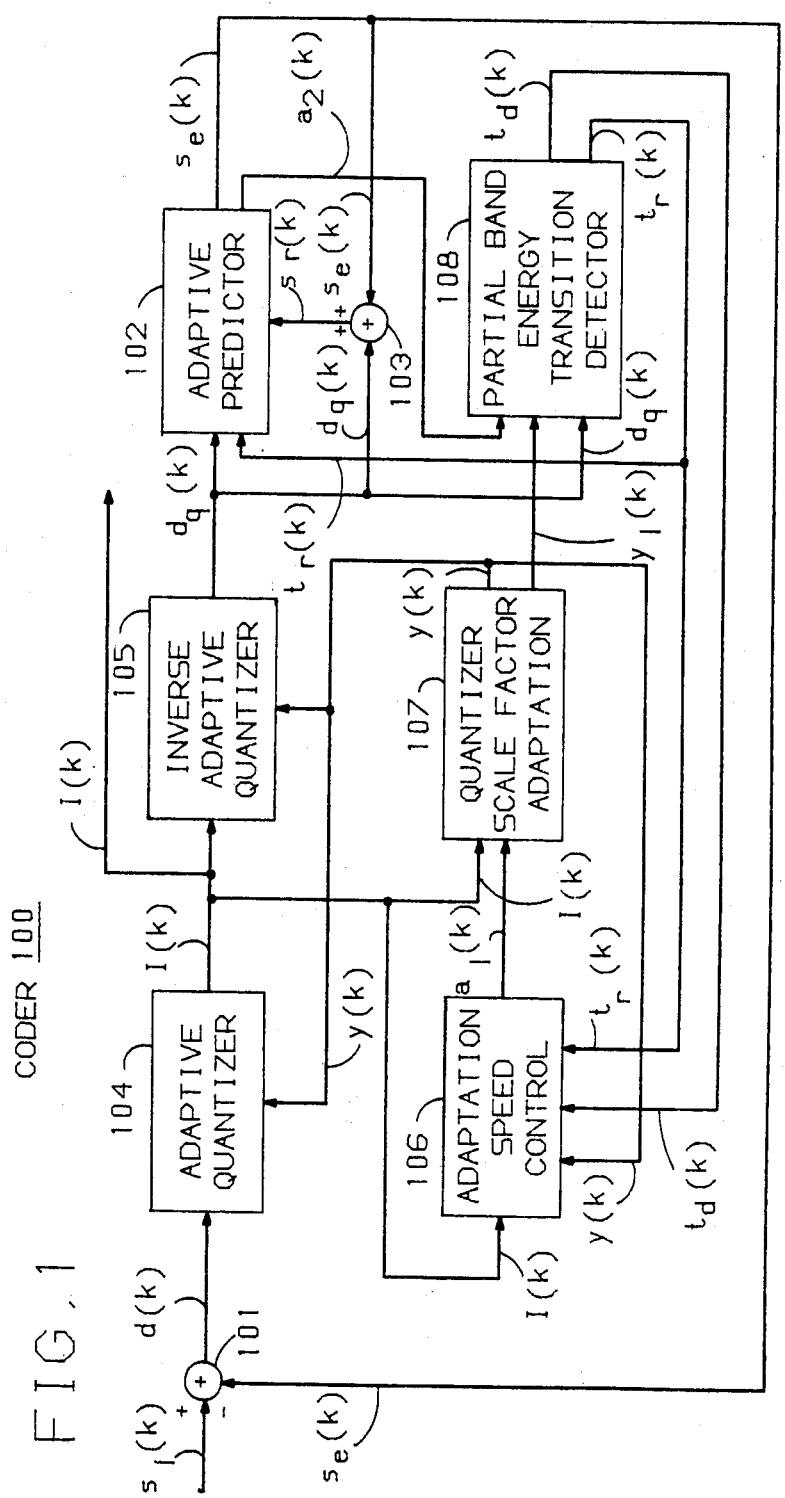
FIG. 1 shows in simplified block diagram form details of an ADPCM coder including an embodiment of the invention.

FIG. 1 shows in simplified block diagram form details of ADPCM coder 100 which includes an embodiment of the invention. Accordingly, coder 100 receives linear PCM samples $s_l(k)$ and encodes the same into n-bit differential PCM samples I(k) for transmission to a remote ADPCM decoder 200 (FIG. 2) iover a transmission facility (not shown). In this example, a 4-bit differential PCM signal (n=4) is assumed. This 4-bit differential PCM signal in conjunction with the ADPCM coding algorithm disclosed in the CCITT Recommendation G.721 cited above, to be described hereinafter, provides very reliable, robust transmissions for speech, voiceband data and tone signals. However, it is to be understood that the invention is in no way limited to this 4-bit differential PCM transmission.

Accordingly, the linear PCM samples $s_l(k)$ are supplied to one input of algebraic difference circuit 101. It is noted that samples $s_l(k)$ are not limited to PCM and could also be PAM samples. Of course, the linear PCM samples may be derived from $\mu$-law PCM or other non-uniform signals such as A-law PCM.

Figure 3:
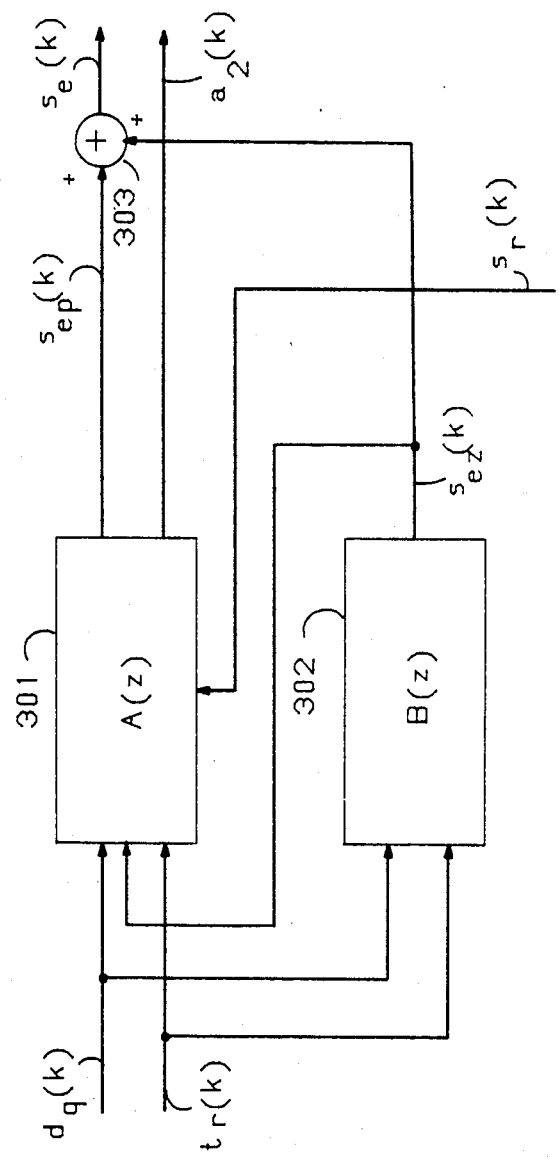
FIG. 3 shows in simplified block diagram form details of the adaptive predictor employed in the coder of FIG. 1 and decoder of FIG. 2.
Figure 4:
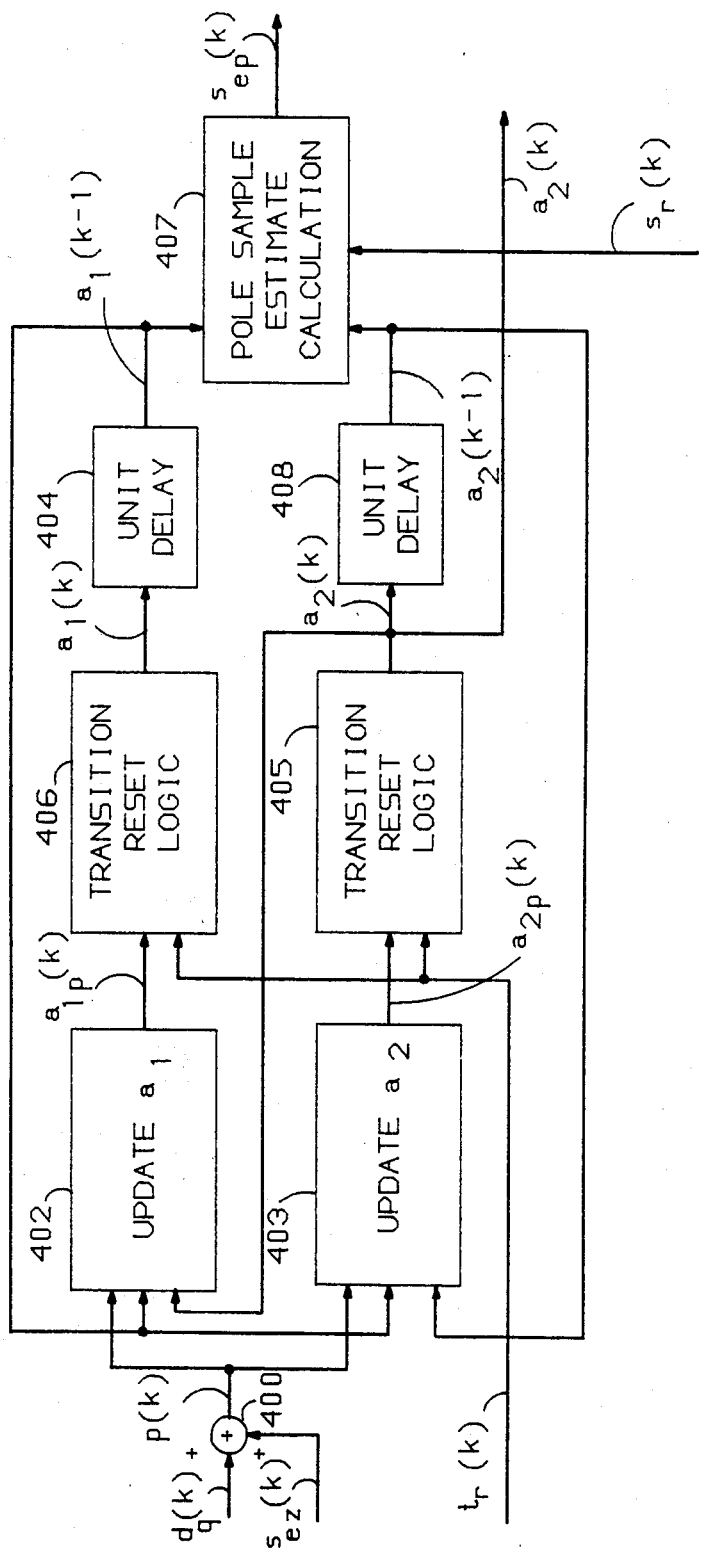
FIG. 4 depicts in simplified block diagram form details of adaptive pole predictor A(z) used in the adaptive predictor of FIG. 3.
Figure 5:
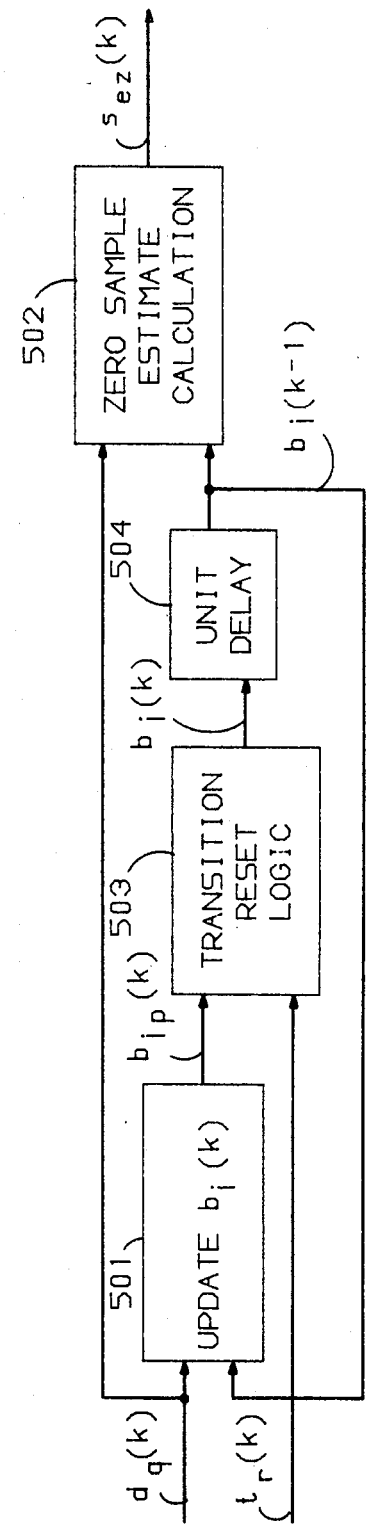
FIG. 5 shows in simplified block diagram form details of adaptive zero predictor B(z) employed in the adaptive predictor of FIG. 3.

Adaptive predictor 102 provides a predicted sample estimate $s_e(k)$ and coefficient sample $a_2(k)$. This predicted sample estimate $s_e(k)$ is a prediction or an estimate of linear PCM sample $s_l(k)$ which is delivered to a difference (−) input of algebraic difference circuit 101 and to an input of adder 103. Adaptive predictor 102 also provides coefficient sample $a_2(k)$ to partial band energy transition detector 108 for use in detecting transitions from one partial band energy signal to another such signal, as described hereinafter. Details of adaptive predictor 102 are shown in FIGS. 3, 4 and 5 and described below.

Accordingly, difference circuit 101 provides at its output difference sample d(k) where $$d(k) = s_l(k) - s_e(k). \qquad (1)$$

Difference sample d(k) is coupled to adaptive quantizer 104. Quantizer 104 comprises, in one example, a 16 level (for n=4) non-uniform ADPCM quantizer characteristic of scale factor y(k). Quantizer 104 generates at its output the 4-bit differential PCM sample I(k). The sample I(k) represents the quantized and differential PCM encoded form of difference sample d(k). One such quantizer which can advantageously be employed in this embodiment is described in the CCITT Recommendation G.721 cited above.

The differential PCM output sample I(k) from coder 100 is transmitted to a remote decoder 200 (FIG. 2) and is supplied to inverse adaptive quantizer 105, adaptation speed control 106 and quantizer scale factor adaptation unit 107. Inverse adaptive quantizer 105 performs an operation that is the inverse of adaptive quantizer 104 and provides at its output a quantized version of the difference sample, namely, $d_q(k)$. Such an inverse adaptive quantizer is also disclosed in the CCITT Recommendation G.721 cited above. The quantized difference sample $d_q(k)$ is supplied to adaptive predictor 102, to an input of adder 103 and to partial band energy transition detector 108.

Adder 103 algebraically adds the predicted sample estimate $s_e(k)$ and the quantized difference sample $d_q(k)$ to provide the reconstructed sample $s_r(k)$, namely, $$s_r(k) = s_e(k) + d_q(k). \qquad (2)$$

The reconstructed sample $s_r(k)$ is supplied to adaptive predictor 102 where it is employed to generate the next predicted sample estimate $s_e(k)$. Also supplied to adaptive predictor 102 is reset trigger signal $t_r(k)$ from partial band energy transition detector 108. Reset trigger signal $t_r(k)$ causes predictor coefficients in adaptive predictor 102 to be set to prescribed values, in accordance with an aspect of the invention, when a transition is detected from a partial band energy signal to another partial band energy signal. The coefficient values which adaptive predictor 102 is set to are selected to generate a value of sample estimate $s_e(k)$ so that the magnitude of difference sample d(k) is limited. In one example, the predictor coefficients are such that a zero value sample estimate $s_e(k)$ is generated. Consequently, the magnitude of difference sample d(k) is limited to the magnitude of the supplied input sample $s_1(k)$.

Figure 6:
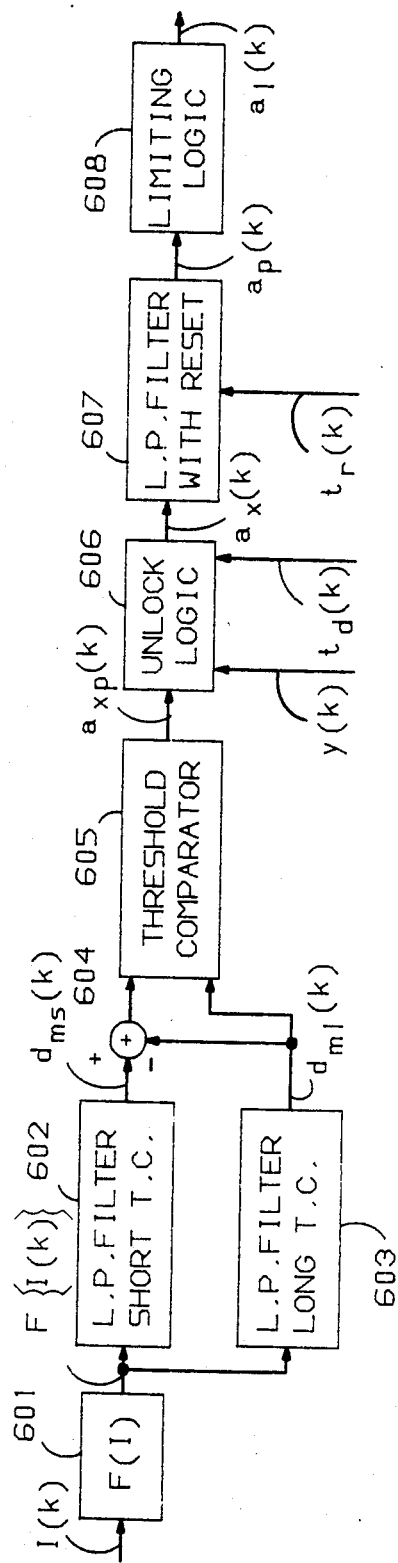
FIG. 6 depicts in simplified block diagram form details of the adaptation speed control used in the coder of FIG. 1 and decoder of FIG. 2.

Adaptation speed control 106 is supplied with differential PCM sample I(k) and with the quantizer scale factor sample y(k) to generate adaptation speed controlling parameter $a_l(k)$. Parameter $a_l(k)$ can assume values in a prescribed range, in this example 0, 1. It tends towards unity for speech signals and towards zero for voiceband data and partial band energy signals, i.e., tones or tone like signals. Also supplied to adaptation speed control 106 are the partial band energy signal detection indication $t_d(k)$ and reset trigger $t_r(k)$ signals from partial band energy detector 108. When the tone detection indication $t_d(k)$ indicates the presence of a partial band energy signal, e.g., a tone, the value of $a_l(k)$ is biased towards a value of unity, i.e., the unlocked state. This permits adaptive quantizer 104 and adaptive inverse quantizer 105 to more rapidly track changes in the difference sample d(k). The reset trigger $t_r(k)$ causes the adaptation speed control parameter $a_l(k)$ to be set to unity when a transition from a partial band energy signal to another partial band energy signal is detected. Again, allowing adaptive quantizer 104 and adaptive inverse quantizer 105 to more rapidly track changes in difference sample d(k). The reasons for employing a so-called locking-unlocking type quantizer adaptation speed control are described in the D. W. Petr U.S. patent cited above. Details of adaptation speed control 106 are shown in FIG. 6 and described below.

Figure 7:
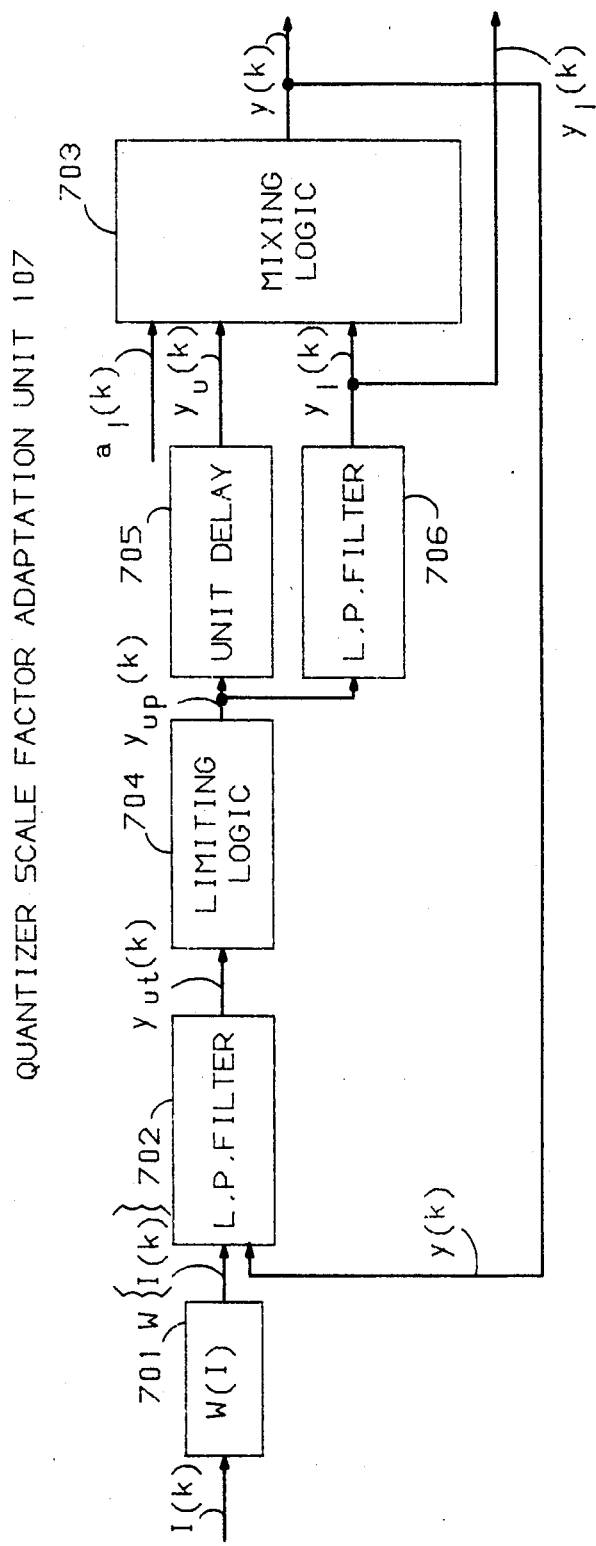
FIG. 7 shows in simplified block diagram form details of the quantizer scale factor adaptation unit utilized in the coder of FIG. 1 and decoder of FIG. 2.

Quantizer scale factor adaptation unit 107 is supplied with the differential PCM sample I(k) and the speed controlling parameter $a_l(k)$ to generate quantizer scale factor y(k) and long term scale factor component $y_l(k)$. Component $y_l(k)$ is supplied to partial band energy transition detector 108. As indicated above, scale factor y(k) is supplied to adaptive quantizer 104, inverse adaptive quantizer 105 and adaptation speed control 106. Details of quantizer scale factor adaptation unit 107 are shown in FIG. 7 and described below.

Partial band energy transition detector 108 is supplied with predictor coefficient $a_2(k)$, long term scale factor component $y_l(k)$ and the quantized version of the difference sample $d_q(k)$ and is responsive thereto to generate $t_d(k)$ which indicates the presence of a partial band energy signal and reset trigger $t_r(k)$ which indicates a transition from a partial band energy signal to another partial band energy signal. These signals, $t_d(k)$ and $t_r(k)$, are advantageously employed, in accordance with the invention, to minimize the generation of impulse noise in a signal to be reconstructed in a subsequent decoder. Details of partial band energy transition detector 108 are shown in FIG. 8 and described below.

Figure 2:
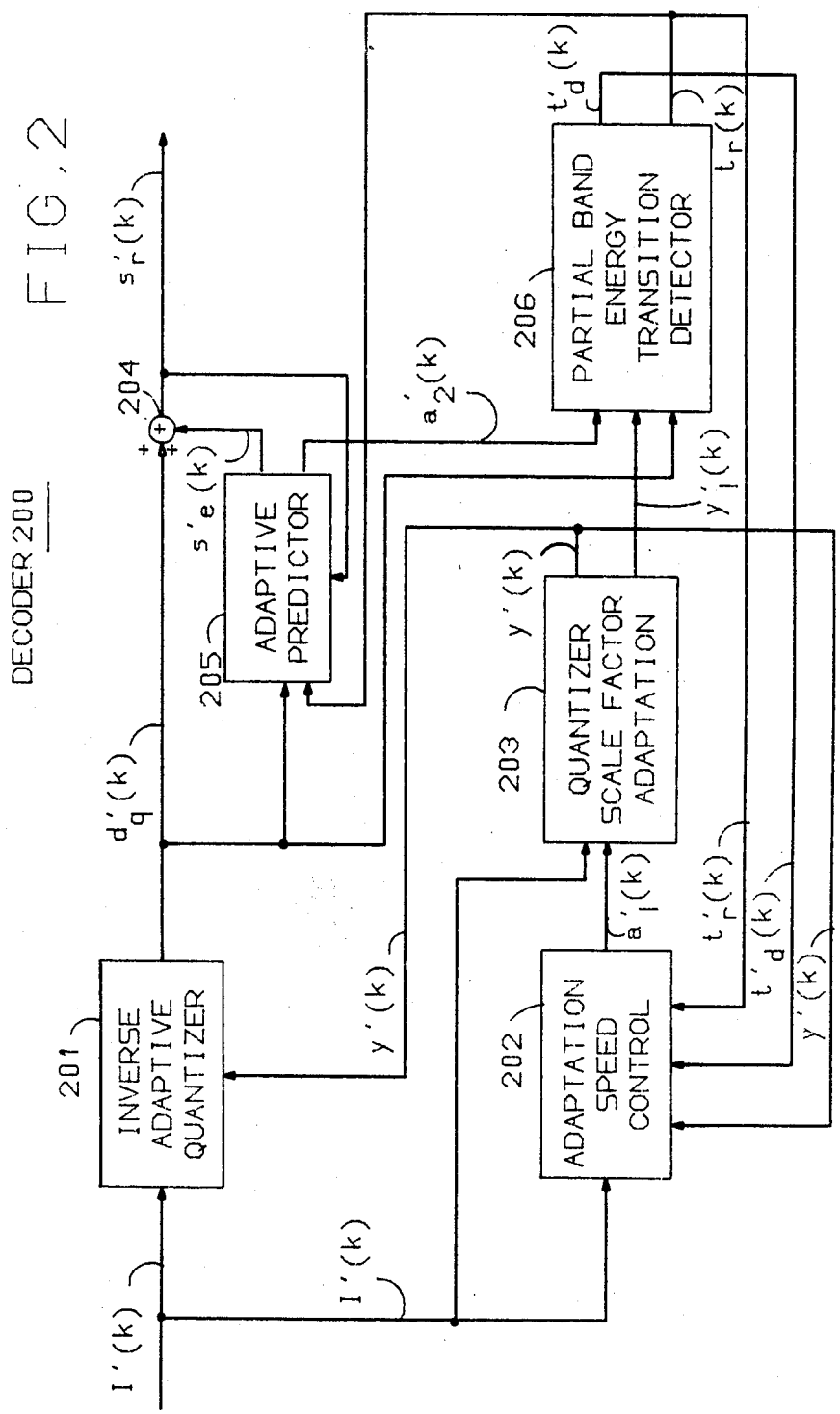
FIG. 2 depicts in simplified block diagram form details of an ADPCM decoder including an embodiment of the invention.

FIG. 2 shows details of decoder 200, also including an embodiment of the invention. The differential PCM sample I(k) is transmitted from coder 100 (FIG. 1) in typical time division multiplexed fashion and is supplied to inverse adaptive quantizer 201, adaptation speed control 202 and quantizer scale factor adaptation unit 203. This sample is designated I'(k), the prime indicating that it is close to and yet, perhaps, not identical with the differential PCM sample I(k) because of transmission errors. Similarly, the other letter symbols in decoder 200 are primed to indicate that they are close to but, perhaps, not identical with the similarly designated symbols or signals of coder 100. Inverse adaptive quantizer 201 is identical to inverse adaptive quantizer 105 (FIG. 1) and it serves to provide at its output the quantized difference sample $d'_q(k)$. The quantized difference sample $d'_q(k)$ is supplied to one input of adder 204, adaptive predictor 205 and partial band energy transition detector 206.

Adaptation speed control 202 is also supplied with the quantizer scale factor y'(k) from quantizer scale factor adaptation unit 203, the partial band energy signal detection indication signal $t'_d(k)$ and the reset trigger $t'_r(k)$ both from partial band energy transition detector 206. Adaptation speed control 202 generates the adaptation speed controlling parameter $a'_l(k)$ and is identical to adaptation speed control 106 (FIG. 1).

Quantizer scale factor adaptation 203 is responsive to the adaptation speed controlling parameter $a'_l(k)$ and the differential PCM sample I'(k) to generate the quantizer scale factor y'(k). The scale factor y'(k) is supplied to inverse adaptive quantizer 201 and adaptation speed control 202. Quantizer scale factor adaptation unit 203 is identical to quantizer scale factor adaptation 107 (FIG. 1).

Adaptive predictor 205 is supplied with the quantized difference sample $d'_q(k)$ and reconstructed sample $s'_r(k)$ from adder 204 and provides the sample estimate $s'_e(k)$ and also coefficient $a'_2(k)$. The sample estimate $s'_e(k)$ is supplied to a second input of adder 204 where it is algebraically summed with the quantized difference sample $d'_q(k)$ to provide the reconstructed sample $s'_r(k)$, namely, $$s'_r(k) = d'_q(k) + s'_e(k). \qquad (3)$$

The reconstructed sample $s'_r(k)$ is supplied to the output of decoder 200 to be used to reconstruct the transmitted signal. Also supplied to adaptive predictor 205 is reset trigger $t'_r(k)$ which causes the predictor coefficient values to be set to the prescribed values when a transition is indicated from a partial band energy signal to another partial band energy signal. It is noted that the values of the coefficients set in predictor 205 are the same as those in predictor 102 (FIG. 1). That is to say, the predictor coefficients in both coder 100 and decoder 200 are set to the same prescribed values when a transition occurs from one partial band energy signal to another such signal. Adaptive predictor 205 is identical to adaptive predictor 102 (FIG. 1).

Partial band energy transition detector 206 is supplied with the quantized difference sample $d'_q(k)$, coefficient $a'_2(k)$ and long term scale factor component $y'_l(k)$ and therefrom provides the indication when a partial band energy signal is present, namely, $t'_d(k)$, and the indication when a transition occurs from a partial band energy signal to another such signal, namely, reset trigger $t'_r(k)$. Partial band energy transition detector 206 is identical to partial band energy transition detector 108 (FIG. 1).

The adaptive predictor 102 of FIG. 1 and 205 of FIG. 2 is shown in greater detail in FIG. 3. Accordingly, shown are adaptive pole predictor A(z) 301, adaptive zero predictor B(z) 302 and adder 303. The quantized difference sample $d_q(k)$ is supplied to both adaptive pole predictor A(z) 301 and adaptive zero predictor B(z) 302. Adaptive zero predictor B(z) 302 generates a zero sample estimate $S_{ez}(k)$ which is supplied to adaptive pole predictor A(z) 301 and to one input of adder 303. Also supplied to adaptive pole predictor A(z) 301 is reconstructed sample $s_r(k)$ and it generates a pole sample estimate $s_{ep}(k)$ and predictor coefficient $a_2(k)$. The pole sample estimate $s_{ep}(k)$ is supplied to a second input of adder 303 where it is added to the zero estimate sample $s_{ez}(k)$ to form the predictor estimate sample $s_e(k)$, namely, $$s_e(k) = s_{ep}(k) + s_{ez}(k). \qquad (4)$$

The reset trigger $t_r(k)$ is supplied to both adaptive pole predictor A(z) 301 and adaptive zero predictor B(z) 302 for setting the predictor coefficients to prescribed values when a transition occurs from a partial band energy signal to another such signal. In one example, the predictor coefficients are reset to zero which, in turn, causes the predictor estimate sample $s_e(k)$ to become zero.

FIG. 4 shows details of adaptive pole predictor A(z) 301 of FIG. 3. Accordingly, the quantized difference sample $d_q(k)$ and the zero estimate sample $s_{ez}(k)$ are supplied to inputs of adder 401 to obtain pole signal p(k), namely, $$p(k) = d_q(k) + s_{ez}(k). \qquad (5)$$

Pole sample p(k) is supplied to update coefficient $a_1$ unit 402 and to update coefficient $a_2$ unit 403. Also supplied to update coefficient $a_1$ unit 402 and update coefficient $a_2$ unit 403 is coefficient $a_1(k-1)$ from unit delay 404. Coefficient $a_2(k)$ from transition reset logic 405 is supplied to update $a_1$ unit 402. Update $a_1$ unit 402 is operative to generate $a_{1p}(k)$, namely, $$a_{1p}(k) = (1-2^{-8})a_1(k-1) + (3 \cdot 2^{-8}) \text{ sgn } [p(k)] \text{ sgn } [p(k-1)] \qquad (6)$$

where $a_{1p}(k)$ is limited by $$|a_{1p}(k)| \leq 1 - 2^{-4} - a_2(k). \qquad (7)$$

Sample $a_{1p}(k)$ is supplied to transition reset logic 406 which yields $a_1(k)$. Transition reset logic 406 controllably sets coefficient $a_1(k)$ to a prescribed value, in this example zero, when reset trigger $t_r(k)$ is a logical 1 representative of the occurrence of a transition from a partial band energy signal, e.g., 1200 Hz tone, to another such signal, e.g., 2200 Hz tone, or vice versa. Thus, $$a_1(k) = 0, \text{ if } t_r(k) = 1 \qquad (8)$$

or $$a_1(k) = a_{1p}(k), \text{ otherwise}. \qquad (9)$$

Unit delay 404 provides $a_1(k-1)$ which is supplied to update $a_1$ unit 402 and to pole signal estimate calculation unit 407. Update $a_2$ unit is operative to generate $a_{2p}(k)$, namely, $$a_{2p}(k) = (1-2^{-7})a_2(k-1) + 2^{-7}\{\text{sgn } [p(k)] \text{ sgn } [p(k-2)] - f[a_1(k-1)] \text{ sgn } [p(k)] \text{ sgn}[p(k-1)]\} \qquad (10)$$

where $$f(a_1) = 4a_1, \text{ for } |a_1| \leq \tfrac{1}{2} \tag{11}$$

or $$f(a_1) = 2 \, \text{sgn} \, (a_1), \text{ for } |a_1| > \tfrac{1}{2} \tag{12}$$

and where $a_{2p}(k)$ is limited by $$|a_{2p}(k)| \leq 0.75. \tag{13}$$

Sample $a_{2p}(k)$ is supplied to transition reset logic 405 which yields $a_2(k)$. Transition reset logic 405 controllably sets coefficient $a_2(k)$ to a prescribed value, in this example zero, when reset trigger $t_r(k)$ is a logical 1 representative of the occurrence of a transition from a partial band energy signal, e.g., 1200 Hz, to another such signal, e.g., 2200 Hz, or vice versa. Thus, $$a_2(k) = 0, \text{ if } t_r(k) = 1 \tag{14}$$

or $$a_2(k) = a_{2p}(k), \text{ otherwise}. \tag{15}$$

Coefficient $a_2(k)$ is supplied to update $a_1$ unit 402, unit delay 408 which yields $a_2(k-1)$ and is outputted. Unit delay 408 output $a_2(k-1)$ is supplied to update $a_2$ unit 403 and to pole sample estimate calculation unit 407. Also supplied to pole sample estimate calculation unit is reconstructed sample $s_r(k)$. Pole signal estimate calculations unit 407 is operative to generate the pole estimate sample $s_{ep}(k)$ in accordance with $$s_{ep}(k) = a_1(k-1)s_r(k-1) + a_2(k-1)s_r(k-2). \tag{16}$$

Except for transition reset logic units 405 and 406 and their operation, the remaining elements of adaptive pole predictor are disclosed in the CCITT Recommendation G.721 cited above.

FIG. 5 shows details of adaptive zero predictor B(z)302 of FIG. 3. Accordingly, the quantized difference sample $d_q(k)$ is supplied to update $b_i(k)$ unit 501 and to zero sample estimate calculation unit 502. Also supplied to update $b_i(k)$ unit 501 is $b_i(k-1)$ from unit delay 504 and is operative to update the coefficients $b_i(k)$ in accordance with $$b_{ip}(k) = (1-2^{-8})b_i(k-1) + 2^{-7} \, \text{sgn} \, [d_q(k)] \, \text{sgn}[d_q(k-i)] \tag{18}$$

for, in this example, $i = 1, 2, \ldots 6$. Sample $b_{ip}(k)$ is supplied to transition reset logic 503 which yields $b_i(k)$. Transition reset logic 503 controllably sets coefficients $b_i(k)$ to prescribed values, in this example all zero, when reset trigger $t_r(k)$ is a logical 1 representative of the occurrence of a transition from a partial band energy signal to another such signal. Thus, $$b_i(k) = 0, \text{ if } t_r(k) = 1 \tag{17}$$

or $$b_i(k) = b_{ip}(k), \text{ otherwise} \tag{19}$$

for, in this example, $i = 1, 2, \ldots 6$. Coefficients $b_i(k)$ are supplied to unit delay 504 which yields $b_i(k-1)$. In turn, coefficients $b_i(k-1)$ are supplied to zero sample estimate calculation unit 502. Zero sample estimate calculation unit 502 provides the zero estimate signal $s_{ez}(k)$ in accordance with $$s_{ez}(k) = \sum_{i=1}^{6} b_i(k-1)d_q(k-i). \tag{20}$$

Except for the transition reset logic 503 and its operation, the remaining elements of adaptive zero predictor B(z)302 are described in the CCITT Recommendation G.721 cited above.

FIG. 6 shows details of adaptation speed control 106 of FIG. 1. Adaptation speed control 202 of FIG. 2 is identical to adaptation speed control 106 and, consequently, will not be described in detail. Accordingly, differential PCM sample I(k) is supplied to function F(I) unit 601 which provides at its output F{I(k)} in accordance with $$\frac{|I(k)|}{F\{I(k)\}} = \frac{7}{7} \left| \frac{6}{3} \right| \frac{5}{1} \left| \frac{4}{1} \right| \frac{3}{1} \left| \frac{2}{0} \right| \frac{1}{0} \left| \frac{0}{0} \right. \tag{21}$$

The value of F{I(k)} is supplied to low pass (L.P.) filter 602 which has a short time constant (T.C.) and to low pass (L.P.) filter 603 which has a long time constant. L.P. filter 602 provides at its output $d_{ms}(k)$ in accordance with $$d_{ms}(k) = (1-2^{-5})d_{ms}(k-1) + 2^{-5}F\{I(k)\}. \tag{22}$$

L.P. filter 603 provides at its output $d_{ml}(k)$ in accordance with $$d_{ml}(k) = (1-2^{-7})d_{ml}(k-1) + 2^{-7}F\{I(k)\}. \tag{23}$$

Sample $d_{ms}(k)$ is supplied to a summing (+) input of difference circuit 604 and sample $d_{ml}(k)$ is supplied to a difference (−) input thereof. The resulting sample $[d_{ms}(k) - d_{ml}(k)]$ is supplied to threshold comparator 605. Also supplied to threshold comparator 605 is sample $d_{ml}(k)$. Threshold comparator yields at its output sample $a_{xp}(k)$ in accordance with $$a_{xp}(k) = 2, \text{ if } |d_{ms}(k) - d_{ml}(k)| \geq 2^{-3}d_{ml}(k) \tag{24}$$

or $$a_{xp}(k) = 0, \text{ otherwise}. \tag{25}$$

When $a_{xp}(k) = 0$, the adaptation speed control is being driven to the so-called "locked" condition. that is to say, the speed is locked to substantially a constant value. This occurs for voiceband data signals and for the so-called partial band energy signals, i.e., tones. When $a_{xp}(k) = 2$, the speed control is being driven to the so-called unlocked condition, the adaptation speed is allowed to vary and can be a fast speed of adaptation for speech signals and the like. Sample $a_{xp}(k)$ is supplied to unlock logic 606. Also supplied to unlock logic 606 is the adaptation scale factor y(k) and the partial band energy signal detection indicator signal $t_d(k)$. Unlock logic 606 is employed to controllably bias the adaptation speed control toward the unlocked condition when a partial band energy signal is present or when the input sample power is very small, as indicated by a value of $y(k) < 3$. This allows the adaptation of the adaptive quantizer and adaptive inverse quantizer of coder 100 and the adaptive inverse quantizer of decoder 200 to respond to more rapidly to the change in the difference sample d(k) caused by a transition from a partial band energy signal, e.g., 1200 Hz, to another such signal, e.g., 2200 Hz. Accordingly, unlock logic generates sample $a_x(k)$ in accordance with $$a_x(k) = 2, \text{ if } y(k) < 3, \quad (26)$$

or $$a_x(k) = 2, \text{ if } t_r(k) = 1, \quad (27)$$

or $$a_x(k) = a_{xp}(k), \text{ otherwise.} \quad (28)$$

Sample $a_x(k)$ is supplied to low pass (L.P.) filter 607. Also supplied to L.P. filter 607 is reset trigger $t_r(k)$. L.P. filter 607 yields sample $a_p(k)$ at its output in accordance with $$a_p(k) = (1-2^{-4})a_p(k-1) + 2^{-4}a_x(k), \text{ if } t_r(k) = 0 \quad (29)$$

or $$a_p(k) = 1, \text{ if } t_r(k) = 1. \quad (30)$$

Thus, L.P. filter 607 in response to reset trigger $t_r(k)=1$, indicating a transition from a partial band energy signal to another such signal, resets the value of $a_p(k)=1$ which biases the speed control toward the unlocked position. This again is to allow a more rapid response to the change in difference signal d(k) which can occur during such transitions. Sample $a_p(k)$ is supplied to limiting logic 608 which yields at its output a limited adaptation speed control sample $a_l(k)$ in accordance with $$a_l(k) = 1, \text{ if } a_p(k) > 1 \quad (31)$$

or $$a_l(k) = a_p(k), \text{ otherwise.} \quad (32)$$

When $a_l(k) = 1$, the adaptation speed is in the totally unlocked condition.

FIG. 7 shows details of quantizer scale factor adaptation unit 107 of FIG. 1. Quantizer scale factor adaptation unit 203 of FIG. 2 is identical to unit 107 and, therefore, only unit 107 will be described in detail. Accordingly, differential PCM sample I(k) is supplied to function W(I) unit 701 which provides at its output W{I(k)} in accordance with $$\frac{|I(k)|}{W\{I(k)\}} = \frac{7}{69.25} \left| \frac{6}{21.25} \right| \frac{5}{11.50} \left| \frac{3}{6.12} \right| \frac{3}{3.12} \left| \frac{2}{1.69} \right| \frac{1}{.25} \left| \frac{0}{-.75} \right. \quad (33)$$

The value of W{I(k)} is supplied to low pass (L.P.) filter 702 along with the scale factor y(k) from mixing logic 703. L.P. filter 702 generates signal $y_{ut}(k)$ in accordance with $$y_{ut}(k) = (1-2^{-5})y(k) + 2^{-5}W\{I(k)\}. \quad (34)$$

In turn, signal $y_{ut}(k)$ is supplied to limiting logic 704 which generates signal $y_{up}(k)$ in accordance with $$y_{up}(k) = 1.06, \text{ if } y_{ut}(k) < 1.06, \quad (35)$$

or $$y_{up}(k) = 10.00, \text{ if } y_{ut}(k) > 10.00, \quad (36)$$

or $$y_{up}(k) = y_{ut}, \text{ otherwise.} \quad (37)$$

Signal $y_{up}(k)$ is supplied to unit delay 705 and to low pass (L.P.) filter 706. Unit delay generates $$y_u(k) = y_{up}(k-1) \quad (38)$$

which is supplied to mixing logic 703. L.P. filter 706 generates signal $y_l(k)$ in accordance with $$y_l(k) = (1-2^{-6})y_l(k-1) + 2^{-6}y_{up}(k) \quad (39)$$

which is also supplied to mixing logic 703 and as an output from quantizer scale factor adaptation unit 107. Also supplied to mixing logic 703 is the limited adaptation speed control signal $a_l(k)$ from adaptation speed control 106. Mixing logic 703 provides at its output scale factor y(k) in accordance with $$y(k) = a_l(k)y_u(k) + [1-a_l(k)]y_l(k) \quad (40)$$

for use as described above. Quantizer scale factor adaptation unit 107 is substantially identical to the arrangement disclosed in the CCITT Recommendation G.721 cited above except that signal $y_l(k)$ is outputted from it for use in the present invention.

FIG. 8 shows details of partial band energy transition detector 108 of FIG. 1. Partial band energy transition detector 206 of FIG. 2 is identical to detector 108 and, therefore, will not be described in detail. We have determined that coefficient $a_2(k)$ approaches a value of $-1.0$ for partial band energy signals, and for single frequency tones $a_2(k)$ would reach a value of $-1.0$. However, in the algorithm described in the CCITT Recommendation G.721 cited above, the value of $a_2(k)$ is limited to a value greater than $-0.75$ for stability reasons. Thus, coefficient $a_2(k)$ is readily usable to determine when a partial band energy signal is being inputted. Accordingly, coefficient $a_2(k)$ from predictor 102 is supplied to comparator 801 which generates signal $t_d(k)$ in accordance with $$t_d(k) = 1, \text{ if } a_2k < -0.71875, \quad (41)$$

$$t_d(k) = 0, \text{ otherwise.} \quad (42)$$

Signal $t_d(k)$, being a logical 1, indicates that a partial band energy signal is present and $t_d(k)$, being a logical 0, indicates that other than a partial band energy signal is present. Signal $t_d(k)$ is supplied to transition detect logic 802 and is outputted from partial band energy detector 107 to be used as described above.

Signal $y_1(k)$ is a measure of the difference sample d(k) power and also the quantized difference sample $d_q(k)$ power. Therefore, by employing $y_l(k)$ to generate the threshold value $d_{qt}(k)$, the reset trigger is independent of the input signal power. This is achieved by normalizing the threshold value $d_{qt}(k)$ with $y_1(k)$ and, consequently, the reset trigger algorithm becomes robust as a function of input signal power. To this end, signal $y_l(k)$ from quantizer scale factor adaptation unit 107 is supplied to threshold computation unit 803 which generates sample $d_{qt}(k)$ in accordance with $$d_{qt}(k) = 24[2^{y_1(k)}] \quad (43)$$

and which is supplied to threshold comparator 804. The quantized difference sample $d_q(k)$ is supplied to absolute value unit 805 which provides at its output $$d_{qm}(k) = |d_q(k)|. \quad (44)$$

Sample $d_{qm}(k)$ is also supplied to threshold comparator 804.

Threshold comparator 804 generates sample $t_{rp}(k)$ in accordance with $$t_{rp}(k) = 1, \text{ if } d_{qm}(k) > d_{qt}(k) \quad (45)$$

or $$t_{rp}(k) = 0, \text{ otherwise}. \quad (46)$$

Sample $t_{rp}(k)$ is also supplied to transition detect logic 802 which generates the reset trigger $t_r(k)$ in accordance with $$t_r(k) = 1, \text{ if } t_{rp}(k) = 1 \text{ and } t_d(k) = 1 \quad (47)$$

or $$t_r(k) = 0, \text{ otherwise}. \quad (48)$$

The reset trigger $t_r(k)$ is used as described above.

What is claimed is:

1. A coder for converting digital samples in a first code to digital samples in a second code, a first code input sample being supplied to a difference circuit along with a sample estimate of said first code input sample to obtain a difference sample indicative of the difference therebetween, adaptive predictor means for generating a plurality of coefficient signals to produce said sample estimate, adaptive quantizing means supplied with said difference sample and being responsive to a scale factor for producing a quantized second code sample and for producing a quantized version of said difference sample, means for adding said quantized version of said difference sample with said sample estimate and supplying the sum thereof to said adaptive predictor, means for dynamically controlling said adaptive quantizing means speed of adaptation including means for producing a first speed of adaptation state when the input sample represents speech and for producing a second speed of adaptation state when the input sample represents encoded voiceband data or partial band energy signals, said coder being characterized by, said adaptive predictor including means responsive to a first control signal or setting said plurality of predictor coefficient signals to predetermined values, and means for detecting transitions from a partial band energy input signal to another such signal and for generating said first control signal indicative of said transitions.

2. The coder as defined in claim 1 wherein said predetermined values of said predictor coefficient signals are all zero.

3. The coder as defined in claim 2 wherein said first code is PCM and said second code is ADPCM.

4. The coder as defined in claim 3 wherein said partial band energy signals are tones.

5. The coder as defined in claim 1 wherein said means for controlling said adaptive quantizing means speed of adaptation includes means responsive to a second control signal for controllably biasing said speed of adaptation from said second state towards said first state, and means for detecting the presence of a partial band energy input signal and for generating said second control signal indicative thereof.

6. The coder as defined in claim 5 wherein said second control signal generating means includes means responsive to a predetermined one of said adaptive predictor coefficient signals for generating said second control signal indicative of the presence of a partial band energy signal.

7. The coder as defined in claim 6 wherein said means for controlling said adaptive quantizing means speed of adaptation further includes means responsive to said first control signal for setting said speed of adaptation to said first state when said first control signal indicates a transition from a partial band energy signal to another such signal.

8. The coder as defined in claim 7 wherein said adaptation speed controlling means includes means for generating a third signal representative of the said quantized difference sample power and wherein said means for detecting transitions and for generating said first control signal includes means responsive to said third signal, said second control signal and said quantized difference signal for generating said first control signal.

9. The coder as defined in claim 8 wherein said means responsive to said third signal, said second control signal and said quantized difference sample includes means for generating a prescribed threshold value as a normalized function of said third signal, means for obtaining an absolute value of said quantized difference sample, means for comparing said threshold value and said absolute value to generate a transition indication signal when said absolute value exceeds said threshold value, and means responsive to said second control signal and said transition indication signal for generating said first control signal.

10. The coder is defined in claim 9 wherein said first control signal is indicative of the occurrence of a transition from a partial band energy signal to another such signal when said second control signal is indicative of the presence of a partial band energy signal and said transition indication signal is indicative that said absolute value exceeds said threshold value.

11. The coder as defined in claim 10 wherein said second control signal is indicative that a partial band energy signal is present when said predetermined one of said adaptive predictor coefficient signals has a value less than a predetermined value.

12. The coder as defined in claim 11 wherein said partial band energy signals are tones.

13. The coder as defined in claim 12 wherein said predetermined values of said predictor coefficient signals are all zero.

14. The coder as defined in claim 13 wherein said first code is PCM and said second code is ADPCM.

15. A decoder for converting digital samples in a second code to digital samples in a first code comprising inverse adaptive quantizer means for receiving input samples in said second code and providing at its output a quantized version of a difference sample that was originally encoded from said first code into said second code, adaptive predictor means for generating a plurality of coefficient signals to produce a sample estimate, means for algebraically combining an estimate sample and said quantized version of said difference sample to obtain a reconstructed sample in said first code, means for dynamically controlling said adaptive inverse quantizing means speed of adaptation including means for producing a first speed of adaptation state when an input sample represents speech and for producing a second speed of adaptation state when the input sample represents encoded voiceband data or partial band energy signals, said decoder being characterized by, said adaptive predictor including means responsive to a first control signal for setting said plurality of predictor coefficient signals to predetermined values, and means for detecting transitions from a partial band energy input signal to another such signal and for generating said first control signal indicative of said transitions.

16. The decoder as defined in claim 15 wherein said predetermined values of said predictor coefficient signals are all zero.

17. The invention as defined in claim 16 wherein said first code is PCM and said second code is ADPCM.

18. The invention as defined in claim 17 wherein said partial band energy signals are tones.

19. The decoder as defined in claim 15 wherein said means for controlling said adaptive quantizing means speed of adaptation includes means responsive to a second control signal for controllably biasing said speed of adaptation from said second state towards said first state, and means for detecting the presence of a partial band energy input signal and for generating said second control signal indicative thereof.

20. The decoder as defined in claim 19 wherein said second control signal generating means includes means responsive to a predetermined one of said adaptive predictor coefficient signals for generating said second control signal indicative of the presence of a partial band energy signal.

21. The decoder as defined in claim 20 wherein means for controlling said adaptive quantizing means speed of adaptation further includes means responsive to said first control signal for setting said speed of adaptation to said first state when said first control signal indicates a transition from a partial band energy signal to another such signal.

22. The decoder as defined in claim 21 wherein said adaptation speed controlling means includes means for generating a third signal representative of the said quantized difference sample power and wherein said means for detecting transitions and for generating said first control signal includes means responsive to said third signal, said second control signal and said quantized difference signal for generating said first control signal.

23. The decoder as defined in claim 22 wherein said means responsive to said third signal, said second control signal and said quantized difference sample includes means for generating a prescribed threshold value as a normalized function of said third signal, means for obtaining an absolute value of said quantized difference sample, means for comparing said threshold value and said absolute value to generate a transition indication signal when said absolute value exceeds said threshold value, and means responsive to said second control signal and said transition indication signal for generating said first control signal.

24. The decoder as defined in claim 23 wherein said first control signal is indicative of the occurrence of a transition from a partial band energy signal to another such signal when said second control signal is indicative of the presence of a partial band energy signal and said transition indication signal is indicative that said absolute value exceeds said threshold value.

25. The decoder as defined in claim 24 wherein said second control signal is indicative that a partial band energy signal is present when said predetermined one of said adaptive predictor coefficient signals has a value less than a predetermined value.

26. The decoder as defined in claim 25 wherein said partial band energy signals are tones.

27. The decoder as defined in claim 26 wherein said predetermined values of said predictor coefficient signals are all zero.

28. The decoder as defined in claim 27 wherein said first code is PCM and said second code is ADPCM.

* * * * *